US012793805B2

(12) United States Patent
Jallamion-Grive et al.

(10) Patent No.: US 12,793,805 B2
(45) Date of Patent: Nov. 10, 2026

(54) REGISTER BANK ARCHITECTURE WITH LATCHES

(71) Applicant: Arm Limited, Cambridge (GB)

(72) Inventors: Yannis Jallamion-Grive, Mouans Sartoux (FR); Yunpeng Cai, Nice (FR); Mohammed Adnan Addou, Biot-Sophia Antipolis (FR); Anil Kumar Baratam, Bangalore (IN); Denil Das Kolady, Bangalore (IN); Chandru Tavarekere Krishnegowda, Antibes (FR); Jad Mohdad, Mougins (FR); Yves Thomas Laplanche, Valbonne (FR); Yannick Marc Nevers, Châteauneuf-Grasse (FR)

(73) Assignee: Arm Limited, Cambridge (GB)

( * ) Notice: Subject to any disclaimer, the term of this patent is extended or adjusted under 35 U.S.C. 154(b) by 435 days.

(21) Appl. No.: 18/100,614

(22) Filed: Jan. 24, 2023

(65) Prior Publication Data

US 2024/0249790 A1 Jul. 25, 2024

(51) Int. Cl.
*G11C 29/30* (2006.01)
*G11C 29/12* (2006.01)
*G11C 29/32* (2006.01)

(52) U.S. Cl.
CPC .......... *G11C 29/30* (2013.01); *G11C 29/1201* (2013.01); *G11C 29/12015* (2013.01); *G11C 2029/3202* (2013.01)

(58) Field of Classification Search
CPC ................ G11C 29/30; G11C 29/1201; G11C 29/12015; G11C 2029/3202; G11C 7/222; G11C 29/32
USPC ......................................................... 365/201
See application file for complete search history.

(56) References Cited

U.S. PATENT DOCUMENTS

| | | | | |
|---|---|---|---|---|
| 7,908,534 | B2 * | 3/2011 | Motika | G11C 29/02 714/729 |
| 12,100,467 | B2 * | 9/2024 | Fujiwara | G11C 29/027 |
| 2002/0184582 | A1 * | 12/2002 | Pouya | G01R 31/318572 714/726 |

* cited by examiner

*Primary Examiner* — Joshua L Schwartz
(74) *Attorney, Agent, or Firm* — Pramudji Law Group PLLC; Ari Pramudji

(57) ABSTRACT

Various implementations described herein are related to a device having a memory architecture with a register bank and multiple latches. The multiple latches may have first latches that receive multi-bit data as input and provide the multi-bit data as output, and multiple latches may have second latches coupled to the first latches so as to receive the multi-bit data from the first latches and then store the multi-bit data.

20 Claims, 4 Drawing Sheets

REGISTER BANK ARCHITECTURE WITH LATCHES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In various modern circuit architectures, conventional flip-flop based scan chains use traditional layout techniques and thus suffer from low density design applications that may typically cause unintended consequences in area and performance. Thus, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to fabrication schemes and techniques for register bank architecture in physical layout designs for various circuit related applications including memory based applications. In some implementations, the schemes and techniques described herein provide for a novel register bank architecture that is based on a latch instead of a flip-flop. Advantageously, a latch operates on a clock level and not a clock edge as with a flip-flop. Also, the schemes and techniques described herein use a primary latch that may be added to operate on a low clock level that may be coupled to other secondary latches that operate on a high clock level. Also, in reference to design-for-testing (DFT) scan chain architectures, various implementations described herein provide an internal scan chain that is supported by known DFT tools.

One advantage of the novel register bank architecture as described herein may refer to significant design improvements by reducing area and by reducing power without impact on timing. By using the latch, the novel register bank architecture described herein is based on a special size of a register bank (e.g., 2-bit data input with 4-bit data storage for each bit) that contribute to efficiency of this concept. Also, the primary latch is shared by several latches so as to enable flip-flop behavior, and also, this technique is not limited to a specific size, wherein this concept may be used in many different configurations that that are valuable in modern circuit designs including memory based designs.

Various implementations of providing various register bank fabrication schemes and techniques for circuit architecture applications will be described in FIGS. 1-3.

Figure 1:
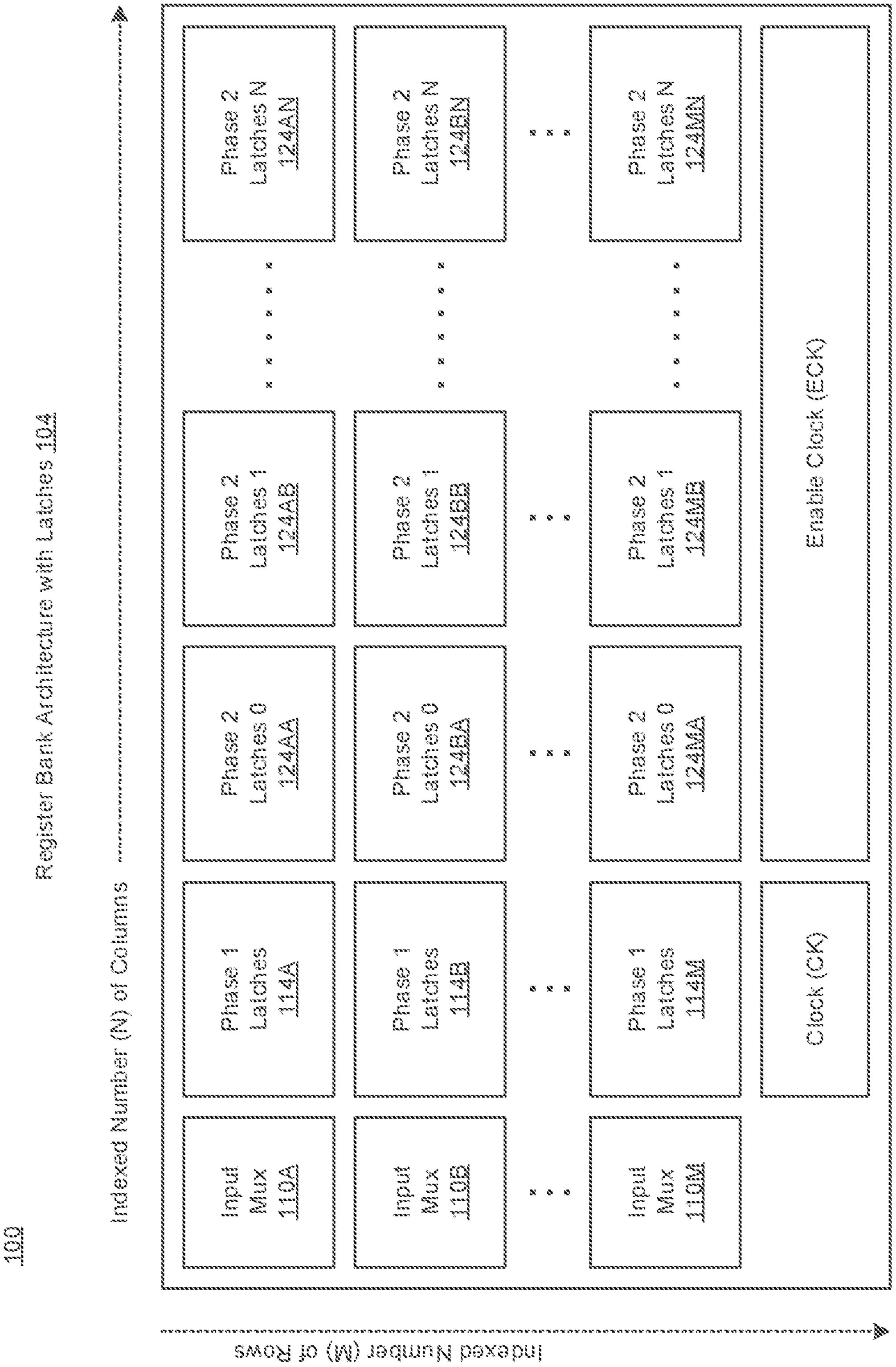
FIG. 1 illustrates a diagram of register bank architecture with latches arranged in rows and columns in accordance with various implementations described herein.

FIG. 1 illustrates a schematic diagram 100 of register bank architecture 104 with multiple latches 114, 124 that may be arranged in a number (M) of rows and a number (N) of columns in accordance with various implementations described herein.

In various implementations, the register bank architecture may be implemented as a system or device having various integrated circuit (IC) components that are arranged and coupled together as an assemblage or combination of parts that provide for physical circuit designs and various related structures. In some instances, a method of designing, providing and fabricating the register bank architecture as an integrated system or device may involve use of various IC circuit components and structures described herein so as to thereby implement fabrication schemes and techniques associated therewith. Also, the register bank architecture may be integrated with various computing circuitry and related components on a single chip, and the register bank architectures may be implemented in various embedded devices and/or systems for automotive, electronic, mobile, computer, server and Internet-of-things (IoT) applications, including remote sensor nodes.

In some implementations, as shown in FIG. 1, the register bank architecture 104 may refer to scan chain architecture for memory based applications. Also, the register bank architecture 104 may have a register bank with multiple latches 114, 124 along with multiple input multiplexers 110, clock circuitry (CK) and enable clock circuitry (ECK) that may be arranged and coupled together in a two-dimensional (2D) array with an indexed number (M) of rows and an indexed number (N) of columns.

The multiple latches 114, 124 may include first latches 114A, 114B, . . . , 114M in a first phase (Phase 1) that receive multi-bit data as input and provide the multi-bit data as output. The first latches 114A, 114B, . . . , 114M may receive the multi-bit data as input and then provide the multi-bit data as output based on a first clock signal (CK) provided by the clock circuitry (CK). Also, the first latches 114A, 114B, . . . , 114M in the first phase (Phase 1) may refer to at least one set of latches (114A, 114B, . . . , 114M) arranged in at least one column with M number of rows.

The multiple input multiplexers 110 may include a multiplexer bank with multiple input multiplexers 110A, 110B, . . . , 110M that receive multi-bit data and provide the multi-bit data based on a scan enable signal (SE). Also, the first latches 114A, 114B, . . . , 114M may receive the multi-bit data as input from one or more input multiplexers 110A, 110B, . . . , 110M in the multiplexer bank and then provide the multi-bit data as output based on the first clock signal (CK). The input multiplexers 110A, 110B, . . . , 110M in the first phase (Phase 1) may refer to at least one set of latches (114A, 114B, . . . , 114M) arranged in at least one column with an M number of rows.

The multiple latches 114, 124 may also include second latches 124A, 124B, . . . , 124M in a second phase (Phase 2) that are coupled to the first latches 114A, 114B, 114M in the first phase (Phase 1) so as to receive the multi-bit data from the first latches 114A, 114B, . . . , 114M and then store the multi-bit data. The second latches 124A, 124B, . . . , 124M may receive the multi-bit data from the first latches 114A, 114B, . . . , 114M and then store the multi-bit data based on a second clock signal (ECK) provided by the enable clock circuitry (ECK). In various instances, the clock signal (CK) may refer to an external clock signal or to an internally generated clock signal, and also, the second clock signal (ECK) may be derived from the first clock signal (CK). Also, in some implementations, the second latches 124A, 124B, . . . , 124M in the second phase (Phase 2) may include a first set of latches (Latches 0: 124A, 124B, . . . , 124M) in a first column (e.g., A column) with M number of rows, a second set of latches (Latches 1: 124A, 124B, . . . , 124M) in a second column (e.g., B column) with M number of rows, and one or more additional sets of latches (Latches N: 124A, 124B, . . . , 124M) in one or more additional columns (e.g., N column) with M number of rows.

In some implementations, in reference to indexing the second latches 124, the first set of latches (Latches 0: 124A, 124B, . . . , 124M) may be indexed as (Latches 0: 124AA, 124BA, . . . , 124MA) in the first column (e.g., A column) with M number of rows. Also, the second set of latches (Latches 1: 124A, 124B, . . . , 124M) may be indexed as (Latches 1: 124AB, 124BB, . . . , 124MB) in the second column (e.g., B column) with M number of rows. Also, the one or more additional sets of latches (Latches N: 124A, 124B, . . . , 124M) may be indexed as (Latches N: 124AN, 124BN, . . . , 124MN) in the second column (e.g., N column) with M number of rows.

In some implementations, the register bank may be configured to provide multi-bit data storage such that each bit in the multi-bit data is stored by a single latch in the second latches 124. Also, the first latches 114A, 114B, . . . , 114M may be coupled to the second latches 124A, 124B, . . . , 124M so that the second latches 124A, 124B, . . . , 124M operate with data based flip-flop behavior, i.e., D flip-flop behavior. Also, the first latches 114A, 114B, . . . , 114M and the second latches 124A, 124B, . . . , 124M may be coupled together so as to operate as a design-for-testing (DFT) scan chain such that each latch in the second latches 124A, 124B, . . . , 124M receives the multi-bit data from the first latches 114A, 114B, . . . , 114M and such that each latch in the second latches 124A, 124B, . . . , 124M stores the multi-bit data with a single latch.

For instance, in scan mode (e.g., when SE=1), the single bit input (SI) may be received from the top row (e.g., the least-significant-bit row) first latch (e.g., only one latch, the top left one), stored in the second latches 124 at a first clock cycle of the clock signal (CK) or the enable clock signal (ECK). In the coming clock cycles, the stored SI signal in the top row second latches 124 may propagate to the next rows by clock cycles. Also, in some applications, the register bank may operate as a shift register, wherein the design may be assumed to have a multi-bit input, such as, e.g., a 5-bit input. Also, the second row (e.g., bottom row) may receive data from a first row latch at a second clock cycle, the third row may receive data from a second row latch at a third clock cycle, etc. such that the fifth row may receive the scan data from a fourth row and output the scan output signal (SO) at a fifth clock cycle.

In some implementations, the Phase 1 latches may refer to primary latches that are coupled to the Phase 2 latches so as to allow flip-flop (FF) behavior. Also, the DFT scan chain may be included and compliant with DFT tools. Also, each bit storage may be insured with one latch instead of one flip-flop, wherein one flip-flop is implemented with at least 2 latches. This concept may operate similar to the conventional flip-flop architecture, but with a significant reduction of area and power, which therefore provides a significant improvement over conventional designs. Also, in some instances, this concept is based on the Phase 1 latches being connected to multiple Phase 2 latches, which may allow this concept to operate with flip-flop" behavior with a latch. Also, this concept may be applied to many different sizable configurations, such as, e.g., the number of input data bits may be increased by increasing the number of rows, and also, the number of storage bits may be increased by increasing the number of columns.

Figure 2:
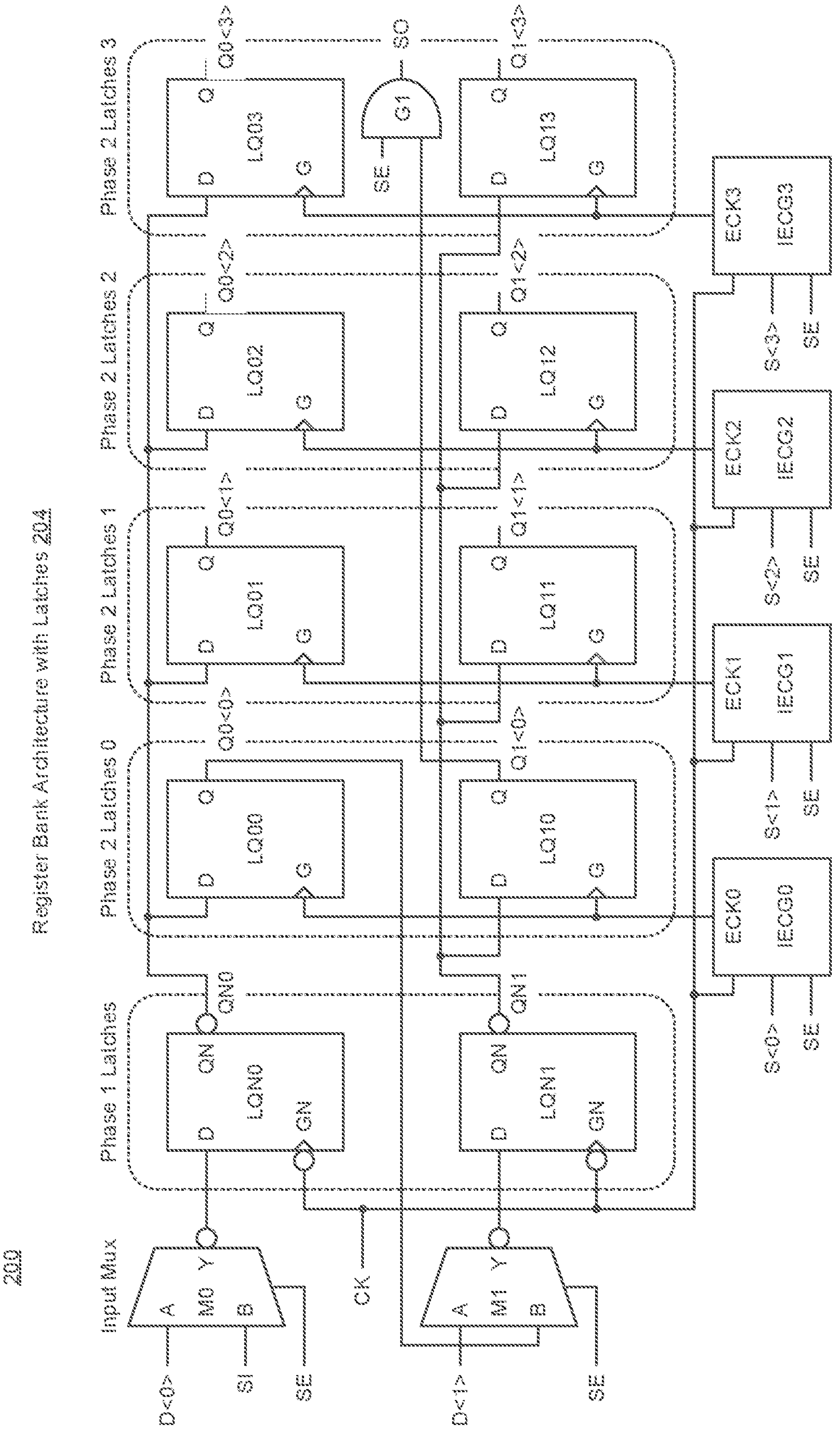
FIG. 2 illustrates another diagram of register bank architecture with latches in accordance with various implementations described herein.

FIG. 2 illustrates a schematic diagram 200 of register bank architecture 204 with multiple latches LQN, LQ that may be arranged in a number (M) of rows and a number (N) of columns in accordance with various implementations described herein. In various applications, the register bank architecture 204 shown in FIG. 2 may refer to a particular implementation of the register bank architecture 104 as shown in FIG. 1, wherein similar components are similar in scope, characteristics and/or behaviors.

In various implementations, the register bank architecture may be implemented as a system or device having various integrated circuit (IC) components that are arranged and coupled together as an assemblage or combination of parts that provide for physical circuit designs and various related structures. In some instances, a method of designing, providing and fabricating the register bank architecture as an integrated system or device may involve use of various IC circuit components and structures described herein so as to thereby implement fabrication schemes and techniques associated therewith. Also, the register bank architecture may be integrated with various computing circuitry and related components on a single chip, and the register bank architectures may be implemented in various embedded devices and/or systems for automotive, electronic, mobile, computer, server and Internet-of-things (IoT) applications, including remote sensor nodes.

In some implementations, as shown in FIG. 2, the register bank architecture 204 may refer to scan chain architecture for memory based applications. Also, the register bank architecture 204 may have a register bank with multiple latches LQN, LQ along with multiple input multiplexers M, clock circuitry (CK) and enable clock circuitry (ECK) that are arranged and coupled together in a two-dimensional (2D) array with an indexed number (M) of rows and an indexed number (N) of columns. In this implementation, the M number of rows may be two (2), and the N number of columns may be four (4). Also, the register bank architecture 204 may include scan output logic (G1) that receives at least one data bit signal of the multi-bit data (D<0>, D<1>) from at least one latch of the second latches LQ and provides the scan output signal (SO) based on the scan enable signal (SE).

The multiple latches LQN, LQ may include first latches LQN0, LQN1 in the first phase (Phase 1) that receive the multi-bit data (D<0>, D<1>) and the scan input signal (SI) as input and then provide the multi-bit data (D<0>, D<1>) as output based on the scan enable signal (SE). The first latches LQN0, LQN1 may receive the multi-bit data (D<0>, D<1>) as input and then provide the multi-bit data (D<0>, D<1>) as output based on the first clock signal (CK) provided to clock input (GN) by the clock circuitry (CK). Also, the first latches LQN0, LQN1 in the first phase (Phase 1) may refer to at least one set of latches LQN0, LQN1 arranged in at least one column with 2 rows. Also, latch LQN0 may receive data from first input mux (M0) at data input (D), receive the clock signal (CK) at inverted clock input (GN), and then provide an output signal (QN0) at an inverted output (QN). Also, latch LQN1 may receive data from second input mux (M1) at data input (D), receive the clock signal (CK) at inverted clock input (GN), and then provide an output signal (QN1) at an inverted output (QN).

The multiple input multiplexers (M) may include a multiplexer bank with multiple input multiplexers M0, M1 that receive the multi-bit data (D<0>, D<1>) and then provide the multi-bit data (D<0>, D<1>) as output (Y) based on the scan enable signal (SE). Also, the first latches LQN0, LQN1 may receive the multi-bit data (D<0>, D<1>) as input from one or more input multiplexers M0, M1 in the multiplexer bank and then provide the multi-bit data (D<0>, D<1>) as output based on the first clock signal (CK). For instance, the first input multiplexer M0 may receive input data (D<0>) at a first input (A), receive the scan input signal (SI) at a second input (B), and then provide the SI signal or the data signal (D<0>) as output (Y) to the data input (D) of latch LQN0. Also, the second input multiplexer M1 may receive input data (D<1>) at a first input (A), receive Q output signal from latch LQ00 at a second input (B), and then provide the data signal (D<1>) or the Q output signal from latch LQ00 as output (Y) to the data input (D) of latch LQN1. In addition, the input multiplexers M0, M1 in the first phase (Phase 1) may refer to at least one set of latches LQN0, LQN1 arranged in at least one column with 2 rows.

The multiple latches LQN, LQ may also include second latches LQ0, LQ1 in a second phase (Phase 2) that are coupled to the first latches LQN0, LQN1 in the first phase (Phase 1) so as to receive the multi-bit data (D<0>, D<1>) from the first latches LQN0, LQN1 and then store the multi-bit data (D<0>, D<1>). The second latches LQ0, LQ1 may receive the multi-bit data (D<0>, D<1>) from the first latches LQN0, LQN1 and then store the multi-bit data (D<0>, D<1>) based on a second clock signal (ECK) provided by the enable clock circuitry (ECK). In some instances, the second clock signal (ECK) may be derived from the first clock signal (CK). Also, the second latches LQ0, LQ1 in the second phase (Phase 2) may include a first set of latches (Latches 0: LQ0, LQ1) in a first column (e.g., column 0) with 2 rows, a second set of latches (Latches 1: LQ0, LQ1) in a second column (e.g., column 1) with 2 rows, a third set of latches (Latches 2: LQ0, LQ1) in a third column (e.g., column 2) with 2 rows, and a fourth set of latches (Latches 3: LQ0, LQ1) in a fourth column (e.g., column 3) with 2 rows.

In some implementations, in reference to indexing the second latches LQ, the first set of latches (Latches 0: LQ0, LQ1) may be indexed as (Latches 0: LQ00, LQ10) in the first column (e.g., column 0) with 2 rows. Also, the second set of latches (Latches 1: LQ0, LQ1) may be indexed as (Latches 1: LQ01, LQ11) in the second column (e.g., column 1) with 2 rows. Also, the third set of latches (Latches 2: LQ0, LQ1) may be indexed as (Latches 2: LQ02, LQ12) in the third column (e.g., column 2) with 2 rows. Also, the fourth set of latches (Latches 3: LQ0, LQ1) may be indexed as (Latches 3: LQ03, LQ13) in the fourth column (e.g., column 3) with 2 rows.

In some implementations, the enable clock circuitry (ECK) may include multiple internal enable clock generators (IECG), such as, e.g., a first IECG that provides a first enable clock (ECK0), a second IECG that provides a second enable clock (ECK1), a third IECG that provides a third enable clock (ECK2), and a fourth IECG that provides a fourth enable clock (ECK3). Also, in some applications, the IECGs may provide the enable clock signals (ECKs) to latches in the second phase (Phase 2) based on the clock signal (CK), various selection signals (S) and the scan enable signal (SE).

Therefore, in various implementations, the 2-bit input data and the 4-bit storage may be controlled by the selection signals (S) including, e.g., a first selection signal S<0>, a second selection signal S<1>, a third selection signal S<2>, and fourth selection signal S<3>. For instance, the first IECG (IECG0) may provide first enable clock signal (ECK0) to latches LQ00 and LQ10 based on the clock signal (CK), the first selection signal S<0> and the scan enable signal (SE). Also, the second IECG (IECG1) may provide the second enable clock signal (ECK1) to the latches LQ01 and LQ11 based on the clock signal (CK), the second selection signal S<1> and the scan enable signal (SE). Also, the third IECG (IECG2) may provide the third enable clock signal (ECK2) to the latches LQ02 and LQ12 based on the clock signal (CK), the third selection signal S<2> and the scan enable signal (SE). Also, the fourth IECG (IECG3) may provide the fourth enable clock signal (ECK3) to the latches LQ03 and LQ13 based on the clock signal (CK), the fourth selection signal S<3> and the scan enable signal (SE).

In some implementations, the register bank may be configured to provide multi-bit data storage such that each bit in the multi-bit data (D<0>, D<1>) is stored by a single latch in the second latches LQ. Also, the first latches LQN0, LQN1 may be coupled to the second latches LQ0, LQ1 so that the second latches LQ0, LQ1 operate with data based flip-flop behavior, i.e., D flip-flop behavior. Also, in some instances, the first latches LQN0, LQN1 and the second latches LQ0, LQ1 may be coupled together so as to operate as a design-for-testing (DFT) scan chain such that each latch in the second latches LQ0, LQ1 receives the multi-bit data (D<0>, D<1>) from the first latches LQN0, LQN1 and such that each latch in the second latches LQ0, LQ1 stores the multi-bit data (D<0>, D<1>) with a single latch in the second latches LQ0, LQ1.

Also, the scan output logic (G1) may receive at least one data bit signal of the multi-bit data (D<0>, D<1>) from at least one latch of the second latches LQ and then provide the scan output signal (SO). In some implementations, the scan output logic (G1) may receive one data bit signal from at least one latch of the second latches LQ, e.g., at the most-significant-bit (MSB) connected row of the second latches LQ and then provide the scan output signal (SO) based thereon. Also, as shown in FIG. 2, the scan-out logic (G1) may receive the scan enable signal (SE), receive the output signal Q1<0> from the latch LQ10 of the second latches LQ, and then provide the scan output signal (SO) based on the signals Q1<0> and SE received as input.

Figure 3:
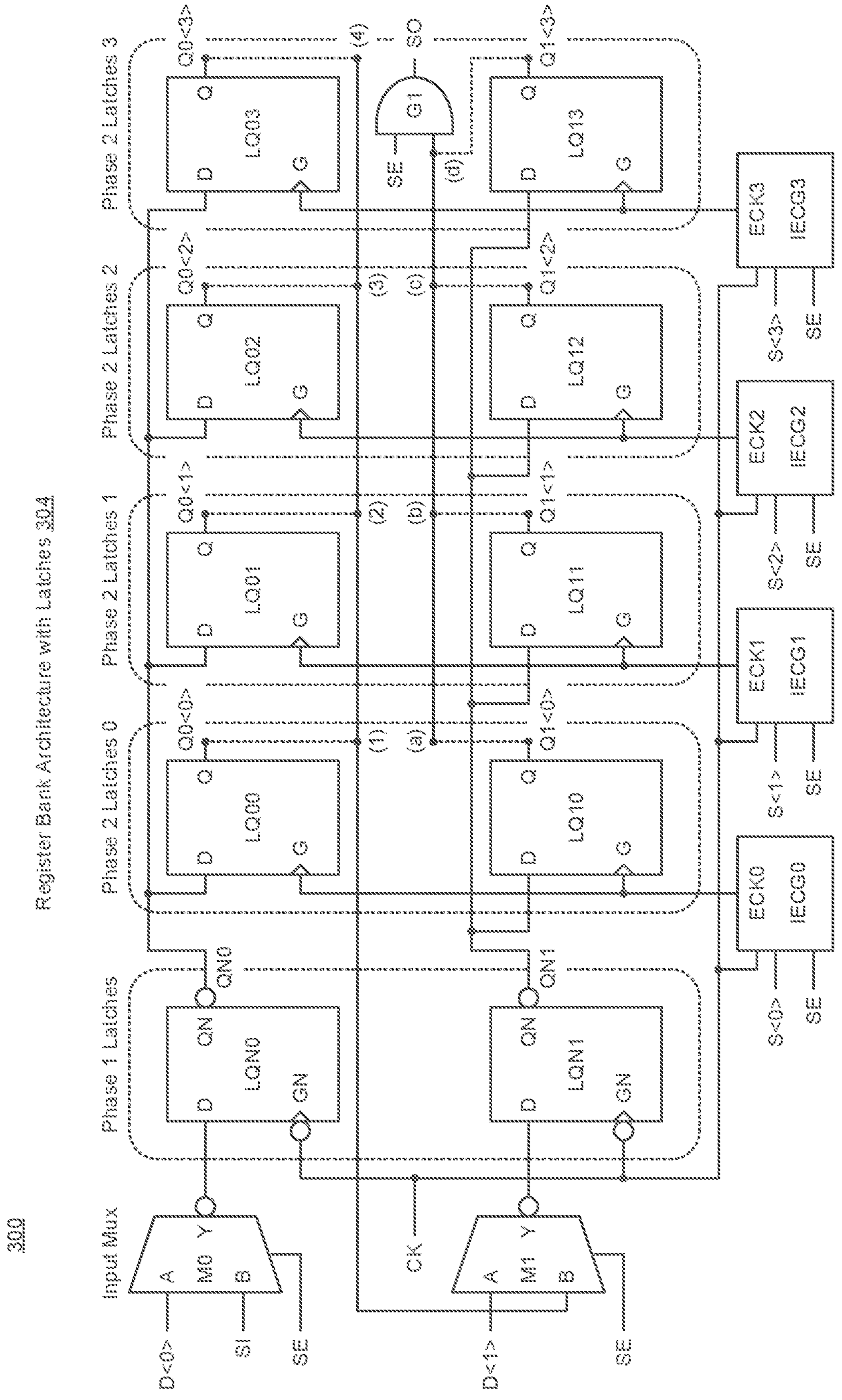
FIG. 3 illustrates another diagram of register bank architecture with latches in accordance with various implementations described herein.

FIG. 3 illustrates a schematic diagram 300 of register bank architecture 304 with multiple latches LQN, LQ that may be arranged in a number (M) of rows and a number (N) of columns in accordance with various implementations described herein. In various applications, the register bank architecture 304 shown in FIG. 3 may refer to a particular implementation of the register bank architecture 204 as shown in FIG. 2, wherein similar components are similar in scope, characteristics and/or behaviors.

In various implementations, the register bank architecture may be implemented as a system or device having various integrated circuit (IC) components that are arranged and coupled together as an assemblage or combination of parts that provide for physical circuit designs and various related structures. In some instances, a method of designing, providing and fabricating the register bank architecture as an integrated system or device may involve use of various IC circuit components and structures described herein so as to thereby implement fabrication schemes and techniques associated therewith. Also, the register bank architecture may be integrated with various computing circuitry and related components on a single chip, and the register bank architectures may be implemented in various embedded devices and/or systems for automotive, electronic, mobile, computer, server and Internet-of-things (IoT) applications, including remote sensor nodes.

In some implementations, as shown in FIG. 3, the register bank architecture 304 may refer to scan chain architecture for memory based applications. Also, the register bank architecture 304 may have a register bank with multiple latches LQN, LQ along with multiple input multiplexers M, clock circuitry (CK) and enable clock circuitry (ECK) that are arranged and coupled together in a two-dimensional (2D) array with an indexed number (M) of rows and an indexed number (N) of columns. In this implementation, the M number of rows may be two (2), and the N number of columns may be four (4). Also, the register bank architecture 204 may include scan output logic (G1) that receives at least one data bit signal of the multi-bit data (D<0>, D<1>) from at least one latch of the second latches LQ and provides the scan output signal (SO) based on the scan enable signal (SE).

In various implementations, the second input multiplexer M1 may receive only one Q output signal (1), (2), (3) or (4) from a single latch LQ00, LQ01, LQ02 or LQ03 of second latches LQ at a second input (B) based on its corresponding ECK signal (ECK0, ECK1, ECK2, ECK3) when its corresponding IECG (IECG0, IECG1, IECG2, IECG3) is activated by the clock signal (CK), the selection signal (S<0>, S<1>, S<2>, S<3>) and the scan enable signal (SE).

In various implementations, the scan output logic (G1) may be coupled to only one latch of the second latches LQ, wherein the first latches LQN may receive one-bit SI data as input and then provide the multi-bit data as output. Also, the second latches LQ may receive the one-bit data from the first latches LQN and then store the multi-bit data in the second latches LQ. Also, the scan output logic (G1) may receive one-data bit signal of the multi-bit data from at least one latch of the second latches LQ and then provide the scan output signal (SO) based thereon.

In various implementations, the scan output logic (G1) may receive only one of the single output data-bit signals (a), (b), (c) or (d) of the multi-bit data (D<0>, D<1>) from only one latch (LQ10, LQ11, LQ12, LQ13) of the second latches LQ as an input and then provide scan output signal (SO) based on scan enable signal (SE) as another input. Also, the scan output signal (SO) may be based on the selected latch's (LQ10, LQ11, LQ12, LQ13) corresponding ECK signal (ECK0, ECK1, ECK2, ECK3) when its corresponding IECG (IECG0, IECG1, IECG2, IECG3) is activated by the clock signal (CK), the selection signal (S<0>, S<1>, S<2>, S<3>) and the scan enable signal (SE).

Figure 4:
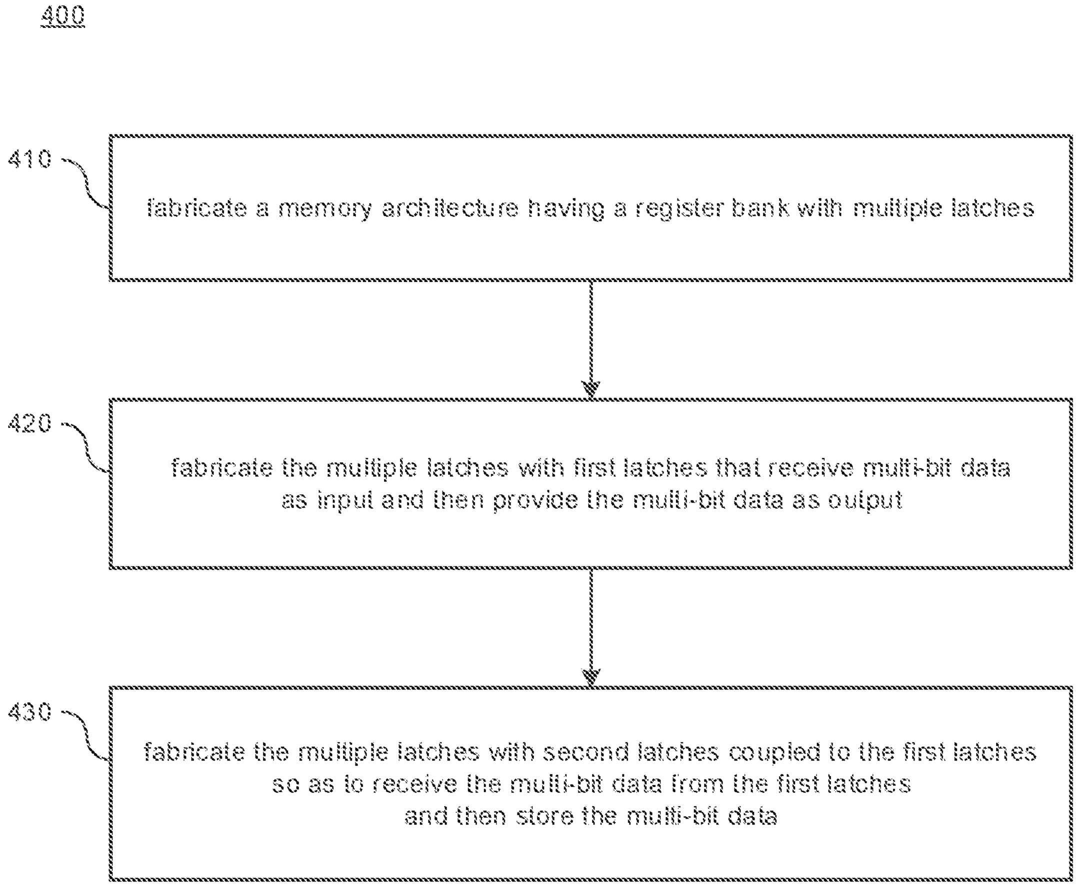
FIG. 4 illustrates a diagram of a method to provide register bank architecture with latches in accordance with various implementations described herein.

FIG. 4 illustrates a process diagram of a method 400 to provide register bank architecture with latches in accordance with implementations described herein.

It should be understood that even though the method 400 indicates a particular order of operation execution, in some instances, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, method 400 may be implemented with program and/or software instruction processes configured for providing register bank architecture with latches, as described herein. Moreover, if implemented in software, instructions related to implementing the method 400 may be stored in memory and/or a database. In various instances, a computer or various other types of computing devices having a processor and memory may be configured to perform method 400.

In various implementations, method 400 may refer to a method for designing, providing, fabricating and/or manufacturing register bank architecture with latches as an integrated system, device and/or circuit that involves use of various IC circuit components described herein so as to thereby implement register bank latch techniques associated therewith. The register bank architecture with latches may be integrated with computing circuitry and related components on a single chip, and the register bank architecture with latches may be implemented in various embedded systems for various electronic, mobile and Internet-of-things (IoT) applications, including sensor nodes.

At block 410, method 400 may fabricate a memory architecture with a register bank having multiple latches. At block 420, method 400 may fabricate the multiple latches with first latches that receive multi-bit data as input and then provide the multi-bit data as output. At block 430, method 400 may fabricate the multiple latches with second latches coupled to the first latches so as to receive the multi-bit data from the first latches and then store the multi-bit data.

In some implementations, the register bank may be configured to provide multi-bit data storage such that each bit in the multi-bit data is stored by a single latch in the second latches. Also, the first latches may be coupled to the second latches so that the second latches operate with data based flip-flop behavior. Also, the first latches may be configured to receive the multi-bit data as input and provide the multi-bit data as output based on a first clock signal. Also, the second latches may be configured to receive the multi-bit data from the first latches and then store the multi-bit data based on a second clock signal that is derived from the first clock signal. Also, the first latches and the second latches may be coupled together to operate as a design-for-testing (DFT) scan chain such that each latch in the second latches receives the multi-bit data from the first latches and such that each latch in the second latches stores the multi-bit data with a single latch.

In some implementations, the first latches and the second latches are coupled together to operate as a design-for-testing (DFT) scan chain such that each latch in the second latches receives the multi-bit data from the first latches and such that each latch in the second latches stores the multi-bit data with a single latch.

In some implementations, method 400 may fabricate a multiplexer bank that is coupled to the register bank, wherein the multiplexer bank may receive the multi-bit data and then provide the multi-bit data based on a scan enable signal. Also, the first latches may receive the multi-bit data as input from one or more multiplexers in the multiplexer bank and then provide the multi-bit data as output based on a first clock signal.

In some implementations, method 400 may also fabricate scan output logic that may receive at least one data bit signal of the multi-bit data from at least one latch of the second latches and then provides a scan output signal. Also, in some instances, the scan output logic may receive one data bit signal from one latch of the second latches at most-significant-bit connected row of second latches and then provide a scan output signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device including a memory architecture having a register bank with multiple latches. The multiple latches include first latches that receive multi-bit data as input and provide the multi-bit data as output, and the multiple latches include second latches coupled to the first latches so as to receive the multi-bit data from the first latches and then store the multi-bit data.

Described herein are various implementations of a device including a scan chain architecture having a register bank with multiple latches. The device may include a multiplexer bank coupled to the register bank. The multiplexer bank may receive multi-bit data and provide the multi-bit data based on a scan enable signal. The multiple latches may include first latches that receive multi-bit data from the multiplexer bank and provides the multi-bit data as output. The multiple latches may include second latches coupled to the first latches so as to receive the multi-bit data from the first latches and then store the multi-bit data.

Described herein are various implementations of a device including a scan chain architecture having a register bank with multiple latches including first latches and second latches. The device may include scan output logic coupled to at least one latch of the second latches. The first latches may receive multi-bit data as input and then provide the multi-bit data as output. The second latches may receive the multi-bit data from the first latches and then store the multi-bit data. The scan output logic may receive at least one data bit signal of the multi-bit data from the at least one latch and then provide a scan output signal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various related techniques described herein, other and further implementations may be devised in accordance with the disclosure herein, which may be determined by the claims that follow.

Although the subject matter has been described herein in language specific to structural features and/or methodological acts, it should be understood that the subject matter defined in the appended claims is not necessarily limited to the specific features or acts described above. Rather, specific features and acts described above are disclosed as example forms of implementing the claims.

What is claimed is:

1. A device comprising:

a memory architecture having a register bank with multiple latches, wherein the multiple latches include first latches that receive multi-bit data as input and provide the multi-bit data as output, and wherein the multiple latches include second latches coupled to the first latches so as to receive the multi-bit data from the first latches and then store the multi-bit data for at least one clock cycle before being overwritten.

2. The device of claim 1, wherein the register bank is configured to provide multi-bit data storage such that each bit in the multi-bit data is stored by a single latch in the second latches.

3. The device of claim 1, wherein the first latches are coupled to the second latches so that the second latches operate with data based flip-flop behavior.

4. The device of claim 1, wherein the first latches and the second latches are coupled together to operate as a design-for-testing (DFT) scan chain such that each latch in the second latches receives the multi-bit data from the first latches and such that each latch stores the multi-bit data with a single latch.

5. The device of claim 1, wherein the first latches receive the multi-bit data as input and provide the multi-bit data as output based on a first clock signal.

6. The device of claim 5, wherein:

the second latches receive the multi-bit data from the first latches and then store the multi-bit data based on a second clock signal derived from the first clock signal, and the second latches are configured for controlled retention of the multi-bit data by storing the multi-bit data in response to an enable clock signal and retaining the stored multi-bit data until a subsequent enable clock signal is received based on a control signal.

7. A device comprising:

a scan chain architecture having a register bank with multiple latches, and a multiplexer bank coupled to the register bank, wherein the multiplexer bank receives multi-bit data and provides the multi-bit data based on a scan enable signal, wherein the multiple latches include first latches that receive multi-bit data from the multiplexer bank and provides the multi-bit data as output, and wherein the multiple latches include second latches coupled to the first latches so as to receive the multi-bit data from the first latches and then store the multi-bit data for at least one clock cycle before being overwritten.

8. The device of claim 7, further comprising:

scan output logic that receives at least one data bit signal of the multi-bit data from at least one latch of the second latches and then provides a scan output signal.

9. The device of claim 7, wherein the register bank is configured to provide multi-bit data storage such that each bit in the multi-bit data is stored by a single latch in the second latches.

10. The device of claim 7, wherein the first latches are coupled to the second latches so that the second latches operate with data based flip-flop behavior.

11. The device of claim 7, wherein:

the scan chain architecture operates as a design-for-testing (DFT) scan chain, and the first latches and the second latches are coupled together to operate as the DFT scan chain such that each latch in the second latches receives the multi-bit data from the first latches and such that each latch stores the multi-bit data with a single latch.

12. The device of claim 7, wherein the first latches receive the multi-bit data as input from one or more multiplexers in the multiplexer bank and then provide the multi-bit data as output based on a first clock signal.

13. The device of claim 12, wherein the second latches receive the multi-bit data from the first latches and then store the multi-bit data based on a second clock signal derived from the first clock signal.

14. A device comprising:

a scan chain architecture having a register bank with multiple latches including first latches and second latches, and scan output logic coupled to at least one latch of the second latches, wherein the first latches receive multi-bit data as input and then provide the multi-bit data as output, wherein the second latches receive the multi-bit data from the first latches and then store the multi-bit data for at least one clock cycle before being overwritten, and wherein the scan output logic receives at least one data bit signal of the multi-bit data from the at least one latch and then provides a scan output signal.

15. The device of claim 14, further comprising:

a multiplexer bank coupled to the first latches in the register bank, wherein the multiplexer bank receives the multi-bit data and provides the multi-bit data to the first latches based on a scan enable signal.

16. The device of claim 14, wherein the register bank is configured to provide multi-bit data storage such that each bit in the multi-bit data is stored by a single latch in the second latches.

17. The device of claim 14, wherein the first latches are coupled to the second latches so that the second latches operate with data based flip-flop behavior.

18. The device of claim 14, wherein:

the scan chain architecture operates as a design-for-testing (DFT) scan chain, and the first latches and the second latches are coupled together to operate as the DFT scan chain such that each latch in the second latches receives the multi-bit data from the first latches and such that each latch stores the multi-bit data with a single latch.

19. The device of claim 15, wherein the first latches receive the multi-bit data as input from one or more multiplexers in the multiplexer bank and then provide the multi-bit data as output based on a first clock signal.

20. The device of claim 19, wherein the second latches receive the multi-bit data from the first latches and then store the multi-bit data based on a second clock signal derived from the first clock signal.

* * * * *